United States Patent [19]

Riggio, Jr.

[11] Patent Number: 5,523,970
[45] Date of Patent: Jun. 4, 1996

[54] NON-VOLATILE MEMORY UTILIZING A THIN FILM, FLOATING GATE, AMORPHOUS TRANSISTOR

[75] Inventor: Salvatore R. Riggio, Jr., Boca Raton, Fla.

[73] Assignee: International Business Machines Incorporated, Armonk, N.Y.

[21] Appl. No.: 260,941

[22] Filed: Jun. 16, 1994

Related U.S. Application Data

[63] Continuation-in-part of Ser. No. 174,724, Dec. 29, 1993, abandoned.

[51] Int. Cl.$^6$ ................................................. G11C 11/34
[52] U.S. Cl. .................... 365/185.01; 365/113; 365/222; 257/52; 257/316
[58] Field of Search ................................. 365/185, 113, 365/161, 900, 185.01, 222; 257/52, 66, 69, 316

[56] References Cited

U.S. PATENT DOCUMENTS

| | | | |
|---|---|---|---|
| 4,460,978 | 7/1984 | Jiang et al. | 365/154 |
| 4,467,451 | 8/1984 | Moyer | 365/165 |
| 4,538,246 | 8/1985 | Wang et al. | 365/226 |
| 4,595,999 | 6/1986 | Betirac | 365/154 |
| 4,635,229 | 1/1987 | Okumura et al. | 365/154 |
| 5,332,682 | 7/1994 | Glenn | 437/52 |

FOREIGN PATENT DOCUMENTS 0300885  4/1989  European Pat. Off. .............. 365/185

OTHER PUBLICATIONS

R. A. Street, "Amorphous silicon electronics", pp. 70–75, MRS Bulletin, Nov. 1992.

M Shur and M. Tack, "Physics of amorphous silicon based allow field–effect transistors", J. App. Phys, 55(10), 15 May 1984, pp. 3831–3842.

Michael Shur, "Physics of semiconductor devices", Prentice Hall, 1990, pp. 437–446.

Arun Madan and Melvin P. Shaw, "The physics and applications of amorphous semiconductors", Academic Press 1988, Chapters 2 and 3 (pp. 35–317).

Primary Examiner—David C. Nelms
Assistant Examiner—Huan Hoang
Attorney, Agent, or Firm—Paul T. Kashimba; Martin J. McKinley; Doug McKechnie

[57] ABSTRACT

A memory controller generates control and address signal for accessing a non-volatile memory having a plurality of addressable cells. Each cell of the non-volatile memory includes a floating gate transistor (e.g., Q15) capable of storing charge (representing a binary 1 or 0) for extended, although not indefinite, periods of time. To refresh any charge that leaks off the floating gate, refresh circuitry (e.g., Q17–Q19) is provided to restore the charge on the gate to its original logical state. This refresh circuitry may be activated at "power-up." Each of the transistors in the memory are preferably thin film, amorphous silicon, "N" type transistors, including the floating gate transistor.

12 Claims, 3 Drawing Sheets

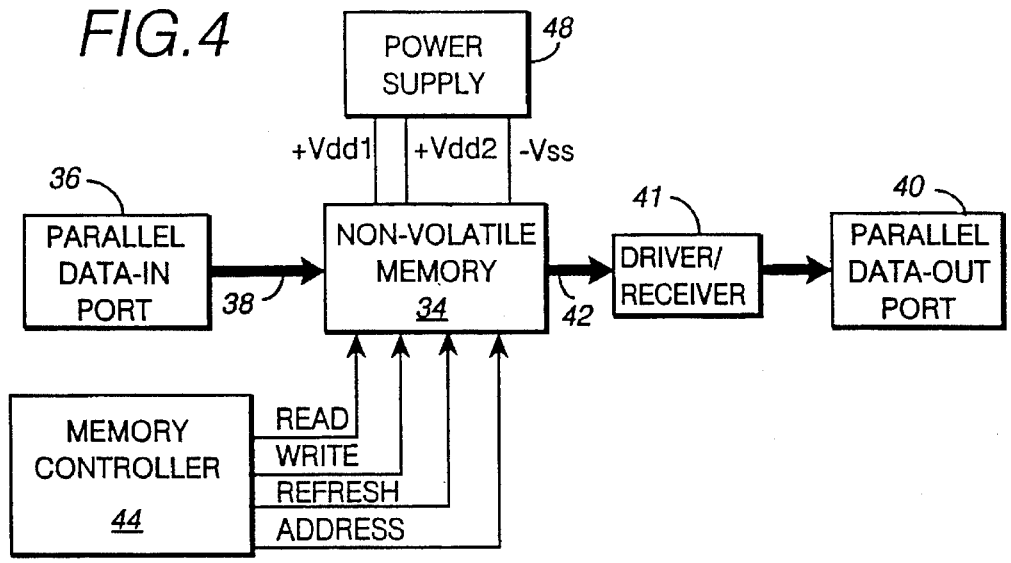
FIG. 4
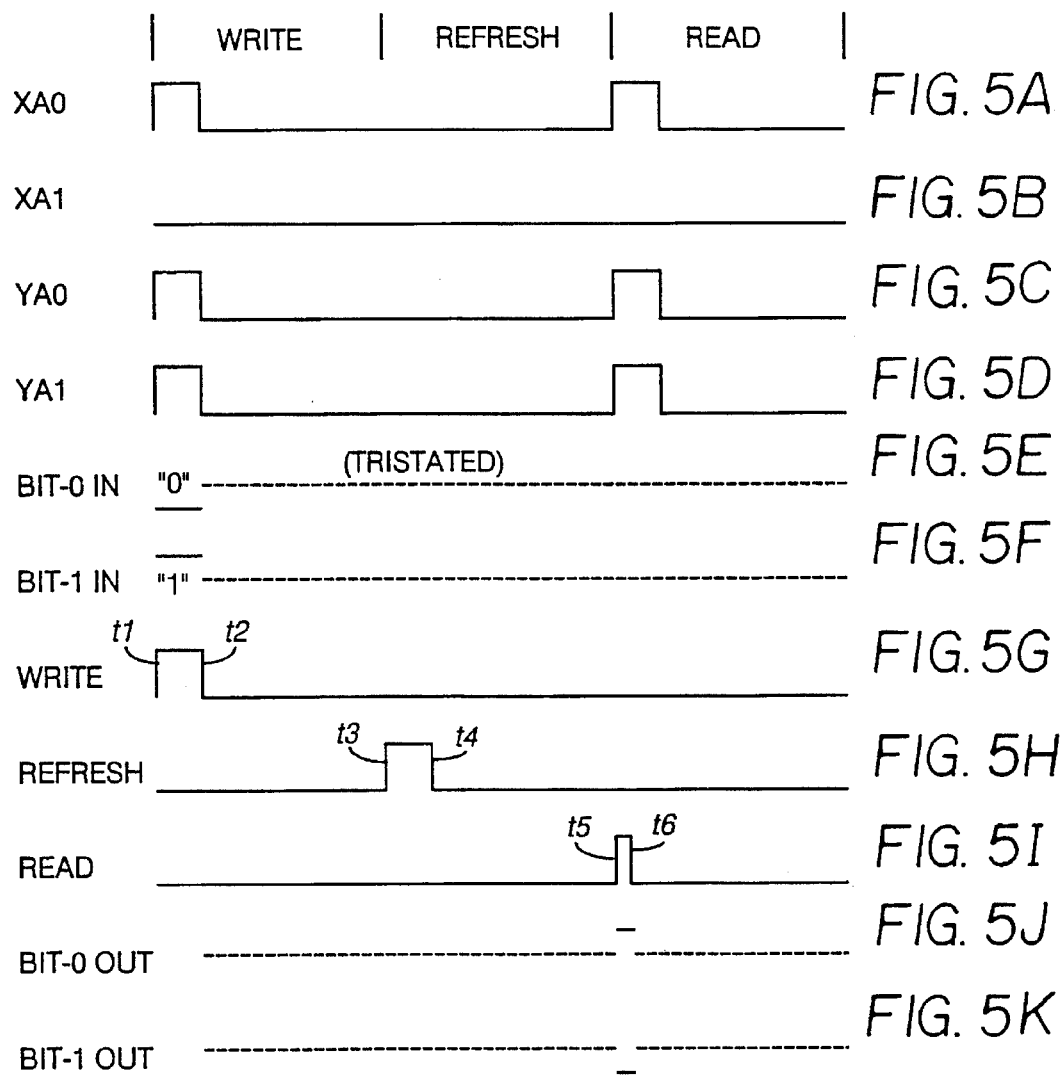

5,523,970

NON-VOLATILE MEMORY UTILIZING A THIN FILM, FLOATING GATE, AMORPHOUS TRANSISTOR

CROSS REFERENCES TO RELATED APPLICATIONS

This application is a continuation-in-part of application Ser. No. 08/174,724, filed Dec. 29, 1993 by Salvatore R. Riggio, Jr. for "A NON-VOLATILE MEMORY UTILIZING A THIN FILM, FLOATING GATE, AMORPHOUS TRANSISTOR", now abandoned.

The following applications, all assigned to the assignee of this application, are also related and are incorporated herein by reference:

(1) Application Ser. No. 08/261,356, filed Jun. 16, 1994 concurrently herewith, for "A NON-VOLATILE REGISTER SYSTEM UTILIZING THIN-FILM, FLOATING-GATE, AMORPHOUS TRANSISTORS", by Salvatore R Riggio, Jr.

(2) Application Ser. No. 08/260,658 filed Jun. 16, 1994 concurrently herewith, for "A NON-VOLATILE PARALLEL-TO-SERIAL CONVERTER SYSTEM UTILIZING THIN-FILM, FLOATING-GATE, AMORPHOUS TRANSISTORS", by Salvatore R. Riggio, Jr.

(3) Application Ser. No. 08/261,352, filed Jun. 16, 1994 concurrently herewith, for "A NON-VOLATILE SERIAL-TO-PARALLEL CONVERTER SYSTEM UTILIZING THIN-FILM, FLOATING-GATE, AMORPHOUS TRANSISTORS", by Salvatore R. Riggio, Jr.

(4) Application Ser. No. 08/261,351, filed Jun. 16, 1994 concurrently herewith, for "AMORPHOUS, THIN FILM TRANSISTOR DRIVER/RECEIVER CIRCUIT WITH HYSTERESIS", by Salvatore R. Riggio, Jr.

BACKGROUND OF THE INVENTION

This invention pertains to memories and, more particularly, to a non-volatile memory that utilizes thin film, amorphous transistors, including a floating gate transistor.

Computers currently use two primary types of read/write memory. Specifically, read/write semiconductor memory (commonly called RAM or random access memory) and magnetic disk memory (for example, "hard" or "floppy" disk drives). Read/write semiconductor memory or RAM is characterized by fast access times, high storage density (bits/cm$^3$), relative high cost per bit of data storage, volatility (volatility is the characteristic whereby data stored in memory is lost as soon as electrical power is removed from the memory) and a lack of moving parts. Magnetic disk memory is characterized by slow access times, low storage density, low cost per bit, non-volatility and moving parts.

Accordingly, the memory described below provides many of the advantages of read/write semiconductor memory, such as fast access time, high storage density and lack of moving parts, with the primary advantage of magnetic disk memory; specifically, non-volatility. In addition, because of the ability to produce this memory on large, single amorphous substrates (rather than the relatively small crystalline substrates of conventional semiconductor devices), this new memory design has the potential to offer a very low cost per bit of data storage.

It is recognized that floating gate transistors have been implemented using crystalline semiconductor material. Such transistors are operated by injecting a charge onto the floating gate by means of an avalanche breakdown of the insulator surrounding the floating gate. Such transistors find use in erasable programmable read only memories (EPROM) where the injected charge can be non-volatilely stored for long periods of time when power is off. However, crystalline floating gate transistor devices have limited use otherwise since it requires a relatively long period of time to erase the charge and reprogram the device, and the insulator has a limited life due to the deleterious effect of the avalanche breakdown.

SUMMARY OF THE INVENTION

One of the objects of the invention is to provide an improved non-volatile memory in which thin film, floating gate, amorphous transistors are used to store data while the memory is being operated and when it is turned off.

Another object of the invention is to provide a non-volatile memory in which all of the transistors used therein are thin film, amorphous transistors of the same majority carrier type, either N-type or P-type for electrons and holes.

A further object of the invention is to provide an improved non-volatile memory having a plurality of thin film, floating gate, amorphous transistors each of which has a floating gate positioned between a control gate and a source whereby capacitive charging thereof controls conduction in a channel between the source and a drain, the capacitive charging also representing a bit of information Still another object of the invention is to provide an improved non-volatile memory having a plurality memory cells each of which contains a thin film, floating gate, amorphous transistor for storing a bit of information, the cells further including circuits that isolate such transistor and resist leakage of a capacitive charge from the control gate, floating gate, and source.

A still further object of the invention is to provide a memory system having a plurality of thin film, floating gate, amorphous transistors for storing data and means for refreshing the data.

Briefly, the invention is a non-volatile memory that includes a data storing means and a means for refreshing the data storing means. The data storing means includes an amorphous, thin film, floating gate transistor.

BRIEF DESCRIPTION OF THE DRAWING

Other objects and advantages of the invention will be apparent from the following description taken in connection with the accompanying drawings wherein:

FIG. 4 is a block diagram of a memory system that embodies the memory shown in FIG. 1; and FIG. 5 is a timing diagram of various exemplary signals generated during the course of operation of the invention.

DESCRIPTION OF AN ILLUSTRATIVE EMBODIMENT

Figure 1:
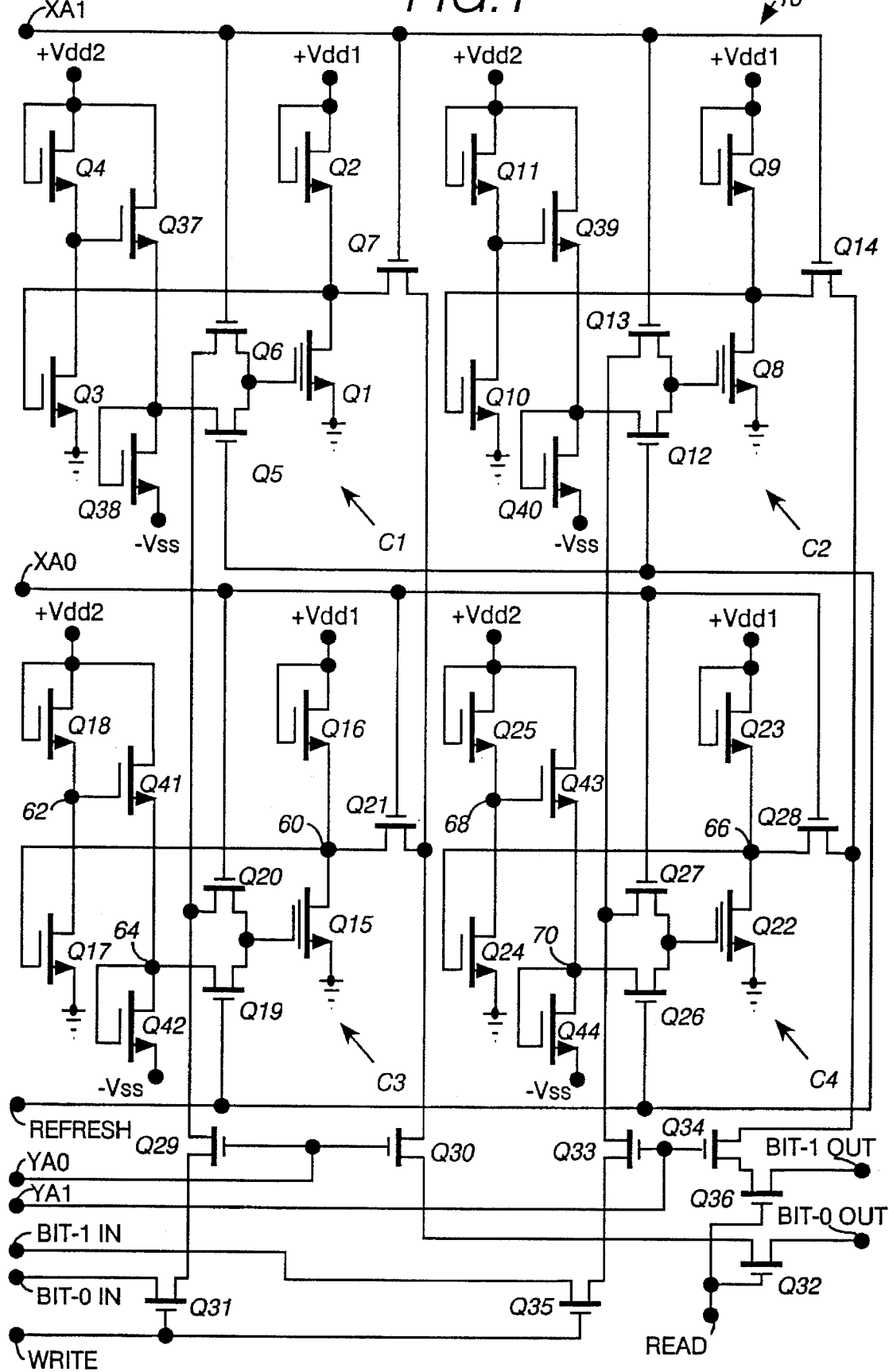
FIG. 1 is a schematic circuit diagram of a memory constructed in accordance with the invention.

FIG. 1 shows a non-volatile memory of the present invention. In the particular embodiment of FIG. 1, four memory cells C1–C4 are illustrated for storing a total of four bits of data as two 2-bit words. Cell C1 comprises transistors Q1 through Q7, Q37, and Q38. Cell C2 comprises transistors Q8 through Q14, Q39 and Q40. Cell C3 comprises transistors Q15 through Q21, Q41, and Q42. Cell C4 comprises transistors Q22 through Q28, Q43, and Q44. Although only four cells are illustrated, it should be apparent to one of skill in the art that this four celled memory can easily be expanded to any number of desired cells, words and bits.

Each of the transistors in the memory is preferably a thin film, amorphous silicon transistor fabricated by depositing metal, insulating and semiconductor materials by sputtering in a vacuum. Although amorphous silicon is preferred, other semiconductor materials may also be suitable. Preferably, all the transistors are "N" type transistors. It should also be apparent to one of skill in the art that this invention could also be constructed from all "P" type transistors, or from a mixture of N and P type transistors. However, it should also be readily apparent that there is a distinct advantage in the ability to fabricate this invention using only one type of transistor, N or P. Thin film transistors can be deposited on a variety of substrate materials, such as glass, quartz or plastic. The substrate material can be either rigid or flexible, and can be comparatively large (for example, 8" by 8"). The construction of thin film transistors is well know in the art. (See, for example, Nick Hall, Jr., Prentice Hall Series In Solid State Physical Electronics, pp 437–446, Prentice Hall, 1990).

Figure 2:
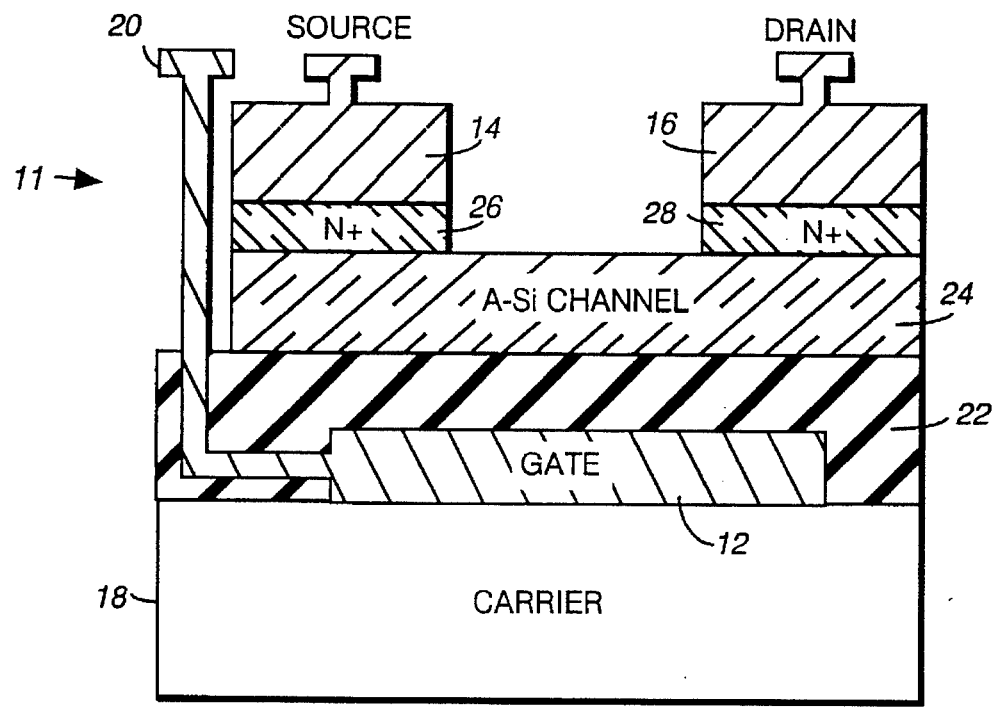
FIG. 2 is a schematic diagram of an amorphous silicon thin-film basic transistor used in the invention.

FIG. 2 schematically shows a basic transistor 11 which is a three terminal, amorphous-silicon (A-Si) thin-film field effect transistor 10 having a gate 12, a source 14, and a drain 16. Gate 12 is made of aluminum deposited on a non-conductive carrier 18. A layer 22 of insulating material covers gate 12, and a thin film A-Si N-channel 24 is deposited on layer 22. An N-channel is a channel through the A-Si in which the majority carriers are electrons. The upper portions of source 14 and drain 16 are formed of aluminum and form contacts or terminals to which other metal lines can be joined allowing the transistor to be integrated into a circuit, the upper portions being deposited on ohmic contacts 26 and 28. These ohmic contacts in turn are deposited at spaced positions on channel 24. Contacts 26 and 28 are preferably formed of N-type semiconductor material. Gate 12 also includes a terminal portion 20 that extends through insulating layer 22. During operation, the presence of a positive (relative to the source) voltage on the gate creates an electric field that causes channel 24 to be conductive allowing current to flow between the source and drain. Basic transistor 11 is used for a variety of configurations and functions including load or current limiting devices, inverters, source followers, electronic switches, and analog switches, as described in more detail below.

Figure 3:
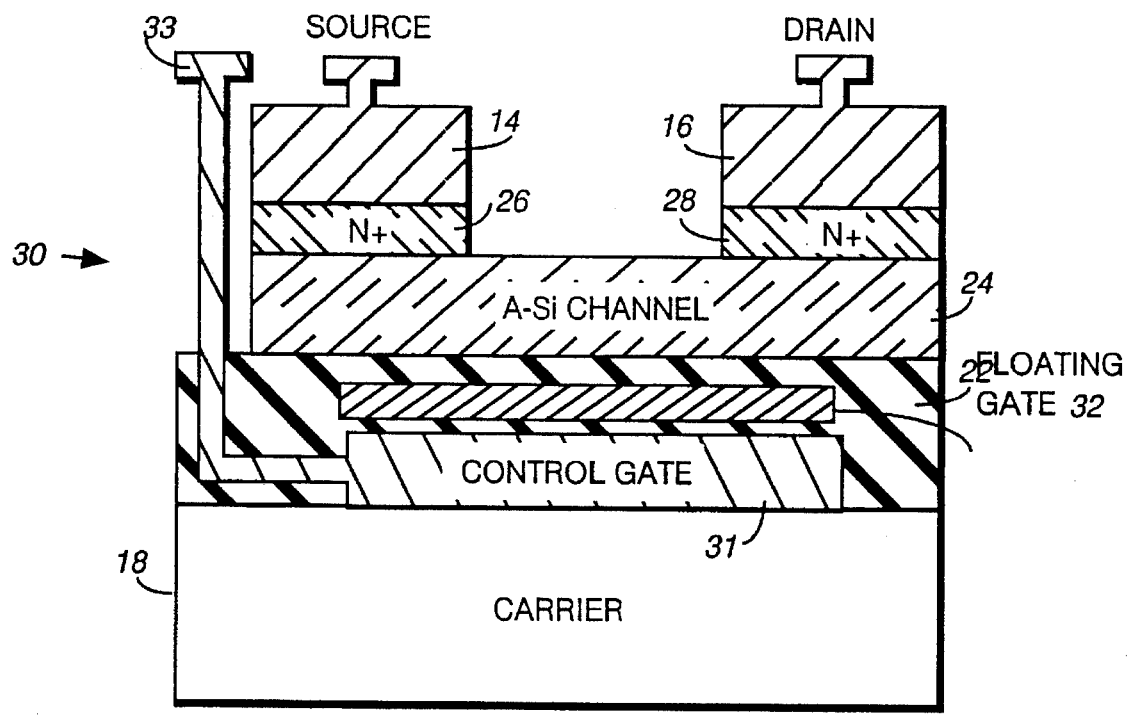
FIG. 3 is a schematic diagram of an amorphous silicon thin-film floating-gate transistor used in the invention.

With reference to FIG. 3, there is shown an amorphous-silicon (A-Si) thin-film floating-gate field-effect transistor 30 that is referred to in the specification and claims simply as a "floating gate" transistor to distinguish it from a "basic" transistor. Transistor 30 has a structure similar to that of transistor 11 except for the addition of a floating gate 32 that is fully enclosed or embedded in insulator 22 between a control gate 31 and channel 24. The floating gate 32 is closer to control gate 31 than it is to either the drain or the source and is capacitively coupled with the control gate, the gate, and the source to form three parallel plate capacitors. Transistor 30 is used as a data storage device where capacitive charging controls the conduction of the channel and represents a bit of information, in the manner described hereinafter. Insulator 22 has a high resistivity against leakage current so that the capacitors can retain a charge for long periods of time when power is off. An insulator made of silicon nitride or polystyrene retains a charge for a period of at least six months. Transistor 30 is also fabricated using the thin film process described above. When a positive voltage of level +Vdd2 is applied to control gate 31, channel 24 becomes conductive, and when a negative voltage of level −Vss is applied to gate 12, channel 24 becomes non-conductive.

With reference to FIG. 4, memory system 34 comprises memory 10, a data-in port 36 for parallel data, a data-in bus 38, a data-out port 40 for receiving parallel data, a data-out bus 42, a driver/receiver 41, a memory controller 44, and a power supply 48. The data-out signals from memory 10 have voltages polarities inverted relative to those of the data-in signals, and driver/receiver 41 inverts the data-out signals prior to being transmitted through port 40. Driver/receiver 41 is the subject of the above-identified related application (4). Memory controller 44 generates READ, WRITE, and REFRESH control signals, and ADDRESS signals, for accessing memory 10 and refreshing the data stored therein, as described in more detail below. Power supply 48 supplies various voltages for operating the memory including +Vdd1, +Vdd2, and −Vss voltages. +Vdd1 is a logic level voltage such as +5 volts, while the +Vdd2 and −Vss are programming voltages of +/−30 volts.

Each of the memory cells is identical so that only one need be described in detail. With reference to FIG. 1, cell C3 comprises a floating gate transistor (FGT) Q15 for storing a data bit in the cell, while the remaining transistors of the cell are basic transistors (such as 11 of FIG. 2) which are connected or configured to perform different functions. Transistors Q19, Q20, and Q21 are analog switches (ASs) each of which has a normally non-conductive channel that becomes conductive or turned on when a positive voltage is applied to the gate of the switch. When the channel is conductive, positive and negative signals are transmitted. AS Q20 is used to write data into FGT Q15, AS Q19 is used to refresh the data stored in FGT Q15, and AS Q21 is used to read the data bit stored in FGT Q15. Transistors Q17 and Q18 are used as load or current limiting devices that limit current flow and produce voltage drops like variable resistors. Transistor Q41 is connected as a source follower for shifting voltage levels, as described below. The other cells have corresponding transistors performing the same functions.

With four cells, memory 10 is organized as a two-word memory with each word having two bits. Cell C3 stores bit-0 of word-0, cell C4 stores bit-1 of word-0, cell C1 stores bit-0 of word-1, and cell C2 stores bit-1 of word-1. The data-in signals include BIT-0 IN and BIT-1 IN, and the data-out signals include BIT-0 OUT and BIT-1 OUT. The cells are addressed by X and Y addresses including XA0 for selecting word-0, XA1 for selecting word-1, YA0 for selecting bit-0, and YA1 for selecting bit-1.

Memory 10 has a plurality of ports respectively identified in FIG. 1 by the names of the signals transmitted by the ports. A READ port is connected to the gates of ASs Q32 and Q36. A WRITE port is connected to the gates of ASs Q31 and Q35. A REFRESH port is connected to the gates of ASs Q19, Q26, Q12, and Q5. A XA0 port is connected to the gates of ASs Q20, Q21, Q27 and Q28. A XA1 port is connected to the gates of ASs Q6, Q7, Q13 and Q14. A YA0 port is connected to the gates of ASs Q29 and Q30. A YA1 port is connected to the gates of ASs Q33 and Q34. When a high switching signal is applied to the gates of these ASs, the channel becomes conductive and the transistors are switched or turned on for transmitting signals through the drains, channels, and sources thereof.

Further structural details and operation of the memory will now be described in terms of examples of write, refresh and read operations as they occur for word-0 in memory cells C3 and C4 relative to the signals illustrated in FIG. 5. For the write cycle, it is assumed that the logic values of BIT-0 IN and BIT-1 IN are "0" and "1", which are respectively represented by a low or negative voltage and a high or positive voltage. It is also assumed that the data in and out lines are tristated at times other than when they carry active bit signals, the tristate status being indicated by the dotted lines.

A write cycle is initiated by the generation of active XA1, YA0, YA1, BIT-0 IN, BIT-1 IN, and WRITE signals at time t1. The active WRITE signal has a one millisecond duration from time t1 to t2. The XA0, YA0 and WRITE signals turn on ASs Q20, Q29 and Q31 thereby coupling the negative BIT-0 IN signal to the control gate of FGT Q15. In response thereto, the control gate/floating gate and the floating gate/source capacitors of FGT Q15 become negatively charged causing the channel to be non-conductive. When the active address and control signals go inactive at time t2, ASs Q20, Q29 and Q31 turn off, the incoming data signal is decoupled from the control gate of Q15, and FGT Q15 retains or stores the capacitive charge representing the "0" data bit. The XA0, YA1 and WRITE signals also turn on ASs Q35, Q33 and Q27 thereby coupling the positive BIT-1 IN signal to the control gate of FGT Q22. In response thereto, the control gate/floating gate and the floating gate/source capacitors of FGT Q15 become positively charged from control gate to source for storing the "1" bit therein and causing the channel to be conductive. When the active address and control signals go inactive at time t2, ASs Q35, Q33 and Q27 turn off, the incoming data signal is decoupled from the control gate of Q22, and Q22 non-volatively stores the charge representing the "1" bit.

At this point, further discussion of the theory of operation of A-Si amorphous FGTs may provide a better understanding of the invention. As indicated previously above relative to FIG. 3, a FGT has three capacitors formed by the capacitive coupling between control gate 31 and floating gate 32, between source 14 and floating gate 32, and between drain 16 and floating gate 32. The floating gate is common to all three capacitors. The field effect due to the voltage between floating gate 32 and source 14 determines if channel 24 is conductive or not. However, the two capacitors (control gate/floating gate and floating gate/source) are in series and act as a voltage divider. Since the floating gate is closer to the control gate than to the source, there is a greater capacitance and hence a lesser voltage drop across the control gate/floating gate capacitor. Thus, in order to develop the necessary voltage between the floating gate and the source for controlling conductivity, it is necessary to apply a greater driving voltage (+/−30 volts) since the voltage drop, occurring between the control gate and the floating gate, is lost or not available for directly controlling or programming the channel conductivity. The data signal applied to control gate 31 causes current to flow and charge the capacitors The capacitors remain charged, when the analog switch connected to the control gate opens, due to the high resistivity in all directions and the fact there is no low impedance leakage path. The control gate/floating gate/source capacitors are isolated and the charge is stored even when power is turned off. In contrast to floating gate transistors formed with crystalline semiconductor material, the A-Si FGTs used in the invention operate using a capacitive charge transference and do not use breakdown voltages and avalanche breakthroughs of the insulator surrounding the floating gate.

Although the data stored in each FGT is "non-volatile", i.e., it will not be lost when the power is removed from the memory, the data is not "permanent" since any charge stored in the FGTs of the various memory cells tends to leak off with time. To preclude this from happening, means are provided for periodically refreshing the data in memory 10. Since the charges may be retained for at least six months, the refreshing need only be done at shorter intervals. Rather than requiring a user to remember when the last refresh occurred, a preferable way is for the data to be refreshed at "power-up" (i.e., every time the power to the computer is turned ON).

In cell C3, the refreshing means comprises Q16, q17, q18, Q19, Q41, and Q42. Q16 is connected as a load device between +Vdd1 and a node 60 connected to the drain of FGT Q15. The node is a common point on the metallization lines that interconnect the devices. is connected to a node 60 and the gate of inverter Q17. When the channel of Q15 is non-conductive as a result of a "0" bit being stored therein, the voltage on node 60 is high. When the channel of Q15 is conductive as a result of a "1" bit being stored therein, the voltage on node 60 is low (close to ground) due to the source being connected to ground. Node 60 thus provides a logic level representing the value of the bit stored in FGT Q15.

The gate of Q17 is also connected to node 60 and the logic level on the node determines if the channel of Q17 is conductive or not. Thus, in the example being described, when the "0" bit is stored in Q15, node 60 is high and Q17 conducts. The drain of Q17 is connected by node 62 to the source of Q18 which is connected as a load device, and the source of Q17 is connected to ground. Q17 and Q18 thus act as an inverter and the logic level on node 62 is inverted relative to the logic level on node 60.

Transistor Q41 is connected as a source follower with its gate connected to node 62, its drain connected to the voltage supply +Vdd2, and its source connected to a node 64. A load device Q42 is connected between node 64 and voltage supply −Vss. Transistors Q41 and Q42 forms a voltage level shifter such that when the gate of Q41 is low, node 64 is pulled down to the −Vss level and when the gate of Q41 is high, node 64 is at the +Vdd2 level. During refresh, Q19 is conductive so that the voltage level at node 64 is coupled through Q19 to the control gate of FGT Q15 and thereby feeds back a data signal to refresh or recharge the FGT to represent the same bit that was previously stored. The signal on node 64 is "in phase" with the polarity of the data signal at the control gate of transistor Q15.

Thus in the example, with a "0" bit stored in Q15, the output of Q15 on node 60 is high and inverted relative to the low data signal inputted into Q15. The high signal on node 60 is inverted to a low signal on node 62 and level shifted to a −Vss signal on node 64 that forms a low data signal for refreshing Q15. Note that the logical state of the data stored in FGT Q15 is inverted twice during a read operation. The first inversion occurs at the drain of Q15, while the second inversion occurs in the inverter Q17/Q18. Consequently, the logical state of the output of the refreshing means is identical to the logical state of the data stored in FGT Q15.

In a similar fashion, when a "1" is stored in cell C4, FGT Q22 conducts and node 66 goes low causing Q24 to become non-conductive. Therefore, node 68 goes high causing node 70 to be pulled up to a high level. During refresh, when AS Q26 is switched on, the high level at node 70 is coupled to the control gate of FGT Q26 and feeds back a positive signal to recharge Q22 to represent the "1" bit.

To refresh the memory cells, the memory controller generates a one millisecond (from time t3 to t4) active REFRESH signal that is transmitted to the gates of ASs Q19, Q26, Q12, and Q5 to turn them on. FGTs Q15, Q22, Q6, and Q8 all recharge in a similar manner, during the time that the REFRESH signal is active. When such signal goes inactive at time t4, the FGTs retain and store the bits for the cells.

A read cycle occurs when the memory controller generates an active READ signal of 10-microsecond duration, in conjunction with address signals for the word to be read. Such signals cause BIT-0 OUT and BIT-1 OUT ports to be coupled to the drains of the addressed FGTs whereby the data is driven onto bus 42. For example, to read the data stored in the previously described write cycle, an active XA0 signal turns on ASs Q21 and Q28, and active YA0 and YA1 signals turns on ASs Q30 and Q34. The READ signal turns on Q32 and Q36. Thus, the bit-0 signal at node 60 is driven through Q21, Q30 and Q32 to BIT-0 OUT port, and the bit-1 signal at node 66 is driven through Q28, Q34, Q36 and BIT-1 OUT port. It is to be noted that loads Q16 and Q23 are used as drivers during a read cycle, in addition to being used during a refresh cycle to feedback the stored bit signals.

While the time for a write cycle is relatively long compared to the times for dynamic RAMs and the above memories may not be suitable for high performance main memories, the times are much faster than access rates of hard drives and therefore memory 10 is highly suitable for use as a hardfile to replace hard drives.

Although an illustrative embodiment of the present invention has been described, it should be understood that other variations and embodiments of the invention are possible without departing from the spirit of the invention as defined by the claims. For example, although each memory cell of the illustrative embodiment includes its own refresh circuitry, it is possible to refresh the cells on a row by row basis, such as is well known in the dynamic RAM art.

What is claimed is:

1. A non-volatile memory comprising:

data storing means comprising an amorphous, thin film, floating gate transistor (FGT) having a data input for receiving a data bit to be stored in said transistor and a load transistor coupled to said FGT, said load transistor being operative to produce a data output signal representing the bit stored in said FGT;

means for refreshing data stored in said data storing means;

said data output signal is inverted relative to the bit inputted into said FGT; and said means for refreshing comprises an inverter for producing a feedback signal inverted relative to said data output signal, and selectively operated means for coupling said feedback signal into said data input of said FGT to refresh the data bit stored therein.

2. The non-volatile memory of claim 1, wherein said inverter includes a plurality of amorphous, thin film transistors.

3. The non-volatile memory of claim 2, wherein said floating gate transistor and said plurality of amorphous, thin film transistors are all of the same type, N or P.

4. A non-volatile memory comprising:

a plurality of memory cells;

each memory cell comprising a thin film amorphous floating gate transistor (FGT) having a control gate; a source; a drain; a channel extending between said source and said drain; an insulator between said control gate and said source, said drain, and said channel; and a floating gate embedded in said insulator;

selectively operated input means coupled to said control gate for writing a data bit into said FGT;

selectively operated output means coupled to said FGT for reading said data bit from said FGT; and selectively operated refreshing means for refreshing said data bit stored in said FGT;

said output means comprising a second transistor connected as a load device for limiting current flow through said FGT and producing a logic signal representing an output bit and an analog switch coupled to transmit said output bit out of said cell.

5. The non-volatile memory in accordance with claim 4 wherein said refreshing means is operative to produce a refreshing signal of the same polarity as said data bit that was written into said FGT, said refreshing means further comprising a selectively actuated second analog switch for coupling said refreshing signal with said input means and said control gate to refresh the data bit stored in said FGT.

6. The non-volatile memory in accordance with claim 5 wherein:

said second transistor and said analog switches are thin film, amorphous transistors each having a channel with the same type of majority carriers as those of said channel of said FGT.

7. A non-volatile memory system comprising:

a non-volatile memory having a plurality of addressable cells;

a first bus for supplying data signals to said memory, said data signals being a first polarity representing a "0" bit and a second polarity representing a "1" bit;

a memory controller operative to selectively generate a WRITE signal for writing data from said first bus into said memory, a READ signal for reading data from said memory, and ADDRESS signals for selectively accessing said cells;

each of said memory cells comprising a thin film amorphous floating gate transistor (FGT) having a control gate; a source; a drain; a channel extending between said source and said drain; an insulator between said control gate and said source, said drain, and said channel; and a floating gate embedded in said insulator; said floating gate being capacitively coupled with said control gate to form a first capacitor in series with a second capacitor comprising said floating gate capacitively coupled with said source, said capacitors being charged in response to data signals applied to said control gate, said channel being conductive when a first data signal of the first polarity is applied to said control gate, said channel being non-conductive when a second data signal of the second polarity is applied to said control gate, a load device connected in series with said channel of said FGT for limiting current flow and generating a logic signal indicative of the value of a bit stored in said FGT, and analog switch means connected in series with said control gate for coupling said control gate with data signals from said first bus in response to said WRITE signal and ADDRESS signals selecting such cell and for decoupling and isolating said control gate at other times to prevent leakage of charge from said control gate.

8. A non-volatile memory system in accordance with claim 7 comprising:

a second bus for transmitting data read from said memory; and second analog switch means connected to said load device for coupling said logic signal to said second bus in response to said READ signal and to ADDRESS signals selecting such cell.

9. A non-volatile memory system in accordance with claim 8 comprising:

refreshing means for refreshing data stored in said cells in response to a REFRESH signal;

said memory controller being operative to selectively generate said REFRESH signal.

10. A non-volatile memory system in accordance with claim 9 wherein:

said logic signal is inverted relative to a data signal applied to said control gate; and said refreshing means is operative to invert said logic signal for coupling to said control gate.

11. A non-volatile memory system in accordance with claim 9 comprising:

a power supply for supplying voltages of a first level for charging said capacitors of said FGT to write data therein and of a second logic level;

said load device being connected to said power supply to receive a voltage of said second level whereby said logic signal is at said second level; and said refreshing means is further operative to shift the level of said logic signal to said first levels for refreshing the data.

12. A non-volatile memory system in accordance with claim 11 wherein:

said load devices, said analog switch means, and said refreshing meas all comprise thin film amorphous transistors of the same majority carrier type as said FGTs.

* * * * *